(12) United States Patent
Shroff et al.

(10) Patent No.: US 9,142,507 B1
(45) Date of Patent: Sep. 22, 2015

(54) STRESS MIGRATION MITIGATION UTILIZING INDUCED STRESS EFFECTS IN METAL TRACE OF INTEGRATED CIRCUIT DEVICE

(71) Applicant: Freescale Semiconductor, Inc., Austin, TX (US)

(72) Inventors: Mehul D. Shroff, Austin, TX (US); Douglas M. Reber, Austin, TX (US); Edward O. Travis, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/193,866

(22) Filed: Feb. 28, 2014

(51) Int. Cl.
*H01L 21/8234* (2006.01)
*H01L 23/528* (2006.01)
*H01L 23/522* (2006.01)
*H01L 21/768* (2006.01)

(52) U.S. Cl.
CPC ........ *H01L 23/528* (2013.01); *H01L 21/76829* (2013.01); *H01L 21/76895* (2013.01); *H01L 23/5226* (2013.01)

(58) Field of Classification Search
CPC ..................................................... H01L 23/528
USPC ......................................................... 438/275
See application file for complete search history.

(56) References Cited

U.S. PATENT DOCUMENTS

| | | | |
|---|---|---|---|
| 6,197,613 B1* | 3/2001 | Kung et al. | .................. 438/106 |
| 6,579,795 B1 | 6/2003 | Hau-Riege | |
| 7,459,786 B2 | 12/2008 | Shimazu et al. | |
| 2004/0251555 A1 | 12/2004 | Asai et al. | |
| 2007/0145567 A1* | 6/2007 | Ning | ............................. 257/691 |
| 2009/0115072 A1* | 5/2009 | Rhyner et al. | ................ 257/778 |
| 2010/0072588 A1* | 3/2010 | Yang | ............................. 257/676 |

OTHER PUBLICATIONS

U.S. Appl. No. 13/956,068, filed Jul. 31, 2013, entitled "Capping Layer Interface Interruption for Stress Migration Mitigation".
U.S. Appl. No. 13/907,119, filed May 31, 2013, entitled "Method for Forming an Electrical Connection Between Metal Layers".
"Ion Beam Deposition", <http://en.wikipedia.org/w/index.php?title=ion_beam_deposition&printable=yes>, Accessed May 28, 2014, 2 pages.
"Electron Beam-Induced Deposition", <http://en.wikipedia.org/w/index.php?title=electron_beam-induced_deposition&printable=yes>, Accessed May 28, 2014, 5 pages.

(Continued)

*Primary Examiner* — Anthony Ho

(57) ABSTRACT

An integrated circuit (IC) device includes a plurality of metal layers having metal traces, and a plurality of vias interconnecting the metal traces. The presence of vacancies within the metal layers may disrupt the functionality of the IC device if the vacancies migrate to the vias interconnecting the metal layers. To mitigate vacancy migration, stressor elements are formed at the metal traces to form stress effects in the metal traces that, depending on type, either serve to repel migrating vacancies from the via contact area or to trap migrating vacancies at a portion of the metal trace displaced from the contact area. The stressor elements may be formed as stress-inducing dielectric or conductive material overlying the metal traces, or formed by inducing a stress memory effect in a portion of the metal trace itself.

20 Claims, 5 Drawing Sheets

(56) References Cited

OTHER PUBLICATIONS

T.C. Huang et al., "Numerical Modeling and Characterization of the Stress Migration Behavior Upon Various 90 Nanometer Cu/Low k Interconnects", IEEE, Jan. 2003, 3 pages.

E.T. Ogawa et al., "Stress-Induced Voiding Under Vias Connected to Wide Cu Metal Leads", IEEE 40th Annual International Reliability Physics Symposium, Jan. 2002, 10 pages.

Robin C.J. Wang et al., "Interfacial Stress Characterization for Stress-induced Voiding in Cu/Low-k Interconnects", Proceedings of 12th IPFA, Jun. 27-Jul. 1, 2005, 4 pages.

* cited by examiner

US 9,142,507 B1

STRESS MIGRATION MITIGATION UTILIZING INDUCED STRESS EFFECTS IN METAL TRACE OF INTEGRATED CIRCUIT DEVICE

BACKGROUND

1. Field of the Disclosure

The present disclosure relates generally to integrated circuit (IC) design and more particularly to mitigation of stress migration in metallization structures of IC devices.

2. Description of the Related Art

Vacancies in the metallization structure of an integrated circuit (IC) device can be created under certain device fabrication conditions. Such vacancies tend to migrate over time, often as a result of changes in the thermal conditions, from regions of higher tensile stress (or lower compressive stress) to regions of lower tensile stress (or higher compressive stress) in the metallization structure in a process generally referred to as "stress migration" or "stress-induced voiding." As vias tend to generate areas of lower tensile stress (or higher compressive stress) vacancies tend to migrate and agglomerate at vias over time, and thus impair the conductance of the vias. With the use of IC devices in high-temperature applications and the use of lower-k back-end-of-the-line (BEOL) dielectrics that have reduced ability to conduct and dissipate away heat and smaller metal geometries, stress migration has increasingly impacted IC device reliability.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

Figure 1:
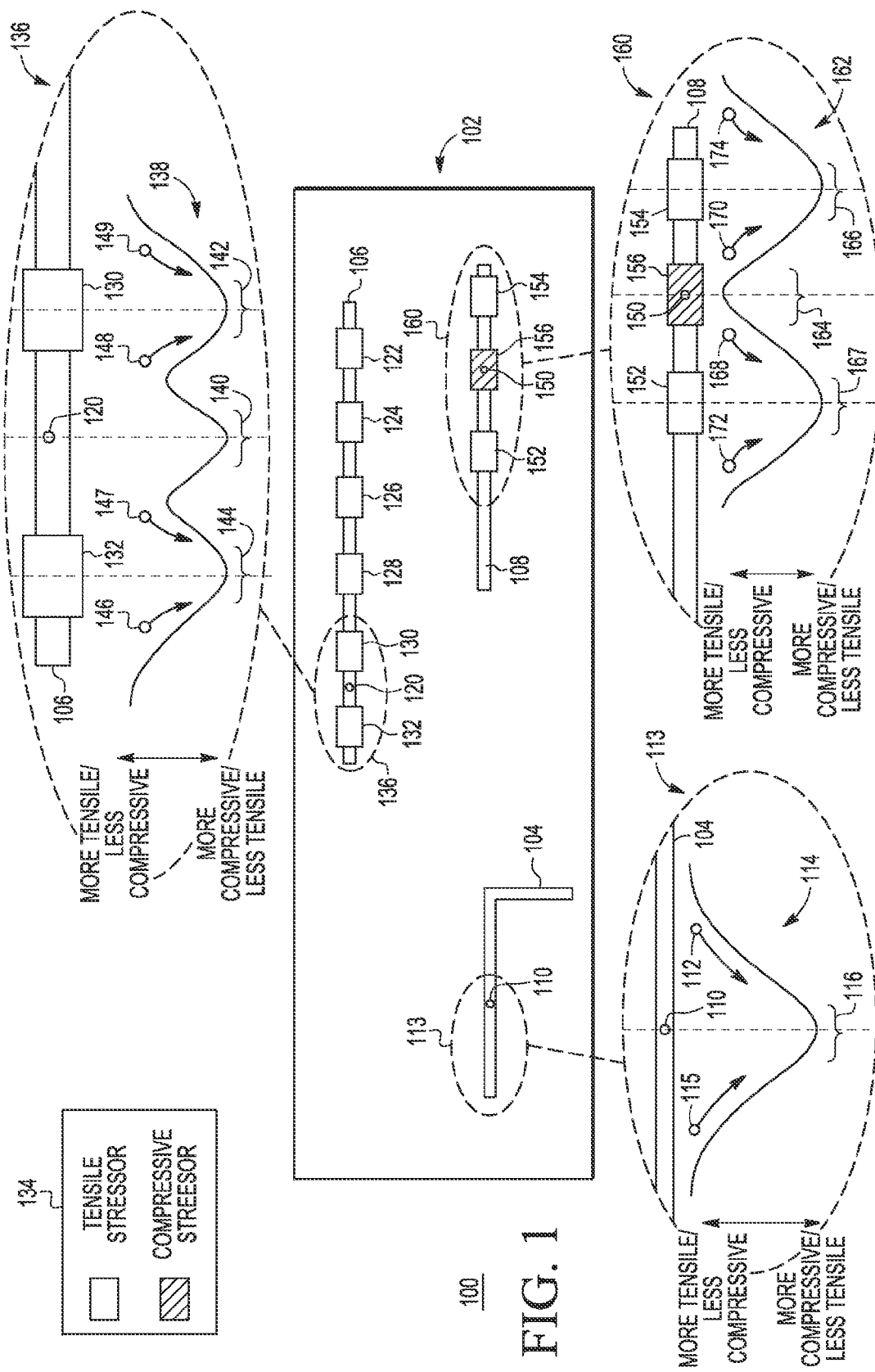
FIG. 1 is a top view of a metal layer of an integrated circuit (IC) device illustrating various example implementations of stressor elements at metal traces of the metal layer for stress migration mitigation in accordance with at least one embodiment of the present disclosure.

FIGS. 1-5 illustrate techniques for mitigating stress migration in the metal stack of an integrated circuit (IC) device through the use of stressor elements formed at metal traces of the metal stack, whereby each stressor element alters a corresponding stress in the metal trace which, depending on the type of stress effect induced, serves to trap or repel vacancies migrating through the metal trace. The stressor elements can be of two different types: compressive and tensile. A tensile stressor element at a metal trace introduces a compressive stress effect at the corresponding region of the metal trace. By introducing a compressive stress effect, the tensile stressor element alters a region of compressive stress to be more compressive or alters a region of tensile stress to be less tensile and therefore tends to attract migrating vacancies. This region of altered stress is thus referred to herein as a "trap region." Conversely, a compressive stressor element at a metal trace introduces a tensile stress effect at the corresponding region of the metal trace. By introducing a tensile stress effect, the compressive stressor element alters a region of tensile stress to be more tensile or alters a region of compressive stress to be less compressive, and therefore tends to repel vacancies. This region of altered stress is thus referred to herein as a "repel region." As such, an IC device can be designed to selectively implement these tensile stressor elements and compressive stressor elements to repel vacancies from certain regions of a metal trace, draw vacancies to certain regions of a metal trace, or a combination thereof. In this manner, the migration of vacancies in the metal stack of the IC device can be mitigated by, in effect, routing or steering the vacancies through the use of trap regions, repel regions, or a combination thereof, to locations whereby the vacancies may have less impact on the reliability of the IC device. To illustrate, as described in greater detail herein, stressor elements may be formed at metal traces so as to mitigate the migration of vacancies to a via contacting the metal trace, and thus mitigating the degree of vacancy formation at the via and the potential loss of reliable conductivity that entails.

In some embodiments, a stressor element is formed as a stress-inducing dielectric material or stress-inducing conductive material overlying a corresponding region of a metal trace with an inter-layer dielectric material overlying the metal trace in one or more areas adjacent to the stressor element. This stress-inducing dielectric material or stress-inducing conductive material may be formed through a selective deposition process or a layer patterning process. In other embodiments, a stressor element may be formed as a part of the metal trace itself, whereby a stress memorization technique (SMT) is used to induce a stress memory effect in a region of the metal trace itself, such that the stress effect is essentially "memorized" or retained in a region of the metal trace. In such instances, reference to a "stressor element" refers to that region of the metal trace that exhibits the induced stress memory effect. Thus, as used herein, the term "stressor element" refers to either a region of a metal trace having an induced stress memorization effect or to material overlying a metal trace without extending to another metal layer and which induces a stress in the metal trace.

FIG. 1 shows a top layer view of a metal layer 102 of a metal stack of an IC device 100 in accordance with at least one embodiment. The metal layer 102 is disposed between dielectric layers of the IC device 100. The metal layer 102 depicts some of the various approaches to utilizing stressor elements for stress migration mitigation in accordance with the techniques described herein. To this end, the metal layer 102 includes three metal traces 104, 106, and 108, with metal trace 104 depicting a conventional implementation without stressor elements (that is, without stress migration mitigation), metal trace 106 implementing a stress migration mitigation configuration using a series of tensile stressor elements, and metal trace 108 implementing a stress migration mitigation configuration using compressive stressor elements and tensile stressor elements. As described below, each of these stress migration mitigation configurations induces a different vacancy migration pattern into the corresponding metal trace. As described in greater detail below with respect to FIG. 4, the stressor elements can be formed as stress-inducing materials that overlie the metal traces, either partially or completely. These stress-inducing materials can include, for example, stress-inducing dielectric materials, stress-inducing capping layer materials, and the like. In other embodiments, the stressor elements can be formed as induced stress memorization effects in the metal traces.

In the depicted example, the metal trace 104 is connected to a metal trace of another metal layer (e.g. an upper or lower metal layer) using a via contacting the metal trace 104 at the illustrated contact area 110. An exploded view 113 of the metal trace 104 in a region around the contact area 110 includes a stress chart 114 aligned with the portion of the metal trace 104 depicted in the exploded view 113, such that the abscissa represents the lateral extent of the portion of the metal trace 104 and the ordinate represents the stress type and magnitude present in the corresponding location of the metal trace 104. As depicted by the stress chart 114, the presence of the via in the metal trace 104 introduces a compressive stress effect in the metal trace 104 in a region extending from the contact area 110, and thus creates a localized compressive stress effect 116 in the metal trace 104 at the contact area 110. As this compressive stress effect 116 creates a region of lower tensile stress than the surrounding regions of the metal trace 104, any vacancies (e.g., vacancies 112, 115) in proximity to the contact area 110 eventually will migrate to the contact area 110, and thus aggregate at the via, which in turn can cause a multitude of issues with the functionality of the IC device 100 and may even cause failure of the IC device 100. As noted above, the term "stressor element" refers to a region of a metal trace having an induced stress memorization effect or to material overlying a metal trace without extending to another metal layer and thus are separate from the vias that extend between metal traces of the IC device 100 as described above.

As with the metal trace 104, the metal trace 106 is mechanically and electrically coupled to a via at a contact area 120. To mitigate vacancy migration into this via, the IC device 100 implements a stress migration mitigation arrangement whereby multiple tensile stressor elements 122, 124, 126, 128, 130, and 132 are at the metal trace 106 at locations that do not overlie the contact area 120. In the depicted example, these tensile stressor elements span at least the entire width of the metal trace 106 at their respective locations. However, as described below, in some embodiments, the stressor elements may be formed so as to span only a portion of the width of a metal trace. Each of these tensile stressor elements 122, 124, 126, 128, 130, and 132 introduces a local compressive stress effect into the metal trace 106 at their respective locations. As vacancies migrate to areas of greater compressive stress, the regions located at or under the tensile stressor elements serve to draw, or "trap" vacancies, from the surrounding regions of the metal trace 106. The region of a metal trace at which a tensile stressor element is formed thus is referred to herein as a "trap region." As shown by key 134 of FIG. 1, trap regions are illustrated as boxes without hatching.

An exploded view 136 of the metal trace 106 in a region surrounding the contact area 120 includes a stress chart 138 aligned with the depicted portion of the metal trace 106. As depicted by the stress chart 138, the presence of the via in the metal trace 106 introduces a compressive stress effect in the metal trace 106 in a region extending from the contact area 120, and thus creates a localized compressive stress effect 140 in the metal trace 106 at the contact area 120. As also depicted by the stress chart 138, each of the tensile stressor elements 130 and 132 introduces a corresponding compressive stress effect in the metal trace 106, and thus alters the stress effect within the metal trace 106 by creating regions of localized compressive stress illustrated by effects 142 and 144, respectively, which are laterally offset from the contact area 120. The regions of compressive stress help to make the stress effect of metal trace 106 more compressive/less tensile in nature (although regions may remain in tensile stress). As such, the regions of the metal trace 106 in which these localized compressive stress effects 142 and 144 form trap regions that draw in vacancies (e.g., vacancies 146, 147, 148, and 149) from the surrounding regions of the metal trace 106. Thus, by placing one or more tensile stressor elements along a lateral length of a metal trace, one or more trap regions can be introduced into the metal trace to trap migrating vacancies in the metal trace.

The metal trace 108 also is connected to a lower metal layer using a via, which interfaces with the metal trace 108 at a contact area 150. To form trap regions near the via for the purpose of trapping migrating vacancies, tensile stressor elements 152 and 154 are formed at the metal trace 108 such that the tensile stressor element 152 is laterally displaced from the contact area 150 in one direction and the tensile stressor element 154 is laterally displaced from the contact area in the opposite direction. Further, to form a repel region to expel vacancies from the region around the via, a compressive stressor element 156 is formed at a location on the metal trace 108 that overlies the contact area 150. In this embodiment, both the tensile and stressor elements span at least the width of the metal trace. As shown by key 134 of FIG. 1, repel regions are illustrated as boxes with hatching.

An exploded view 160 of the metal trace 108 in a region surrounding the contact area 150 includes a stress chart 162 aligned with the depicted portion of the metal trace 108. As depicted by the stress chart 162, the compressive stressor element 156 introduces a tensile stress effect in the metal trace 108 in a region extending from the contact area 150, and thus alters the tensile stress effect 164 in the metal trace 108 around the contact area 150, whereby this tensile stress effect 164 compensates for the compressive stress effect induced by the via by altering the effect in this region of the metal trace 108 to be more tensile/less compressive in nature. As also depicted by the stress chart 162, each of the tensile stressor elements 152 and 154 introduces a corresponding compressive stress effect in the metal trace 108, and thus alters the compressive stress effects 166 and 167, respectively, which are laterally offset from the contact area 150 by making the effect more compressive/less tensile in nature. As a result of the formation of the repel region centered around the contact area 150 of the via and the two trap regions laterally offset from the contact area 150, vacancies in proximity to the via (e.g., vacancies 168 and 170) are driven away from the via toward the trap regions and vacancies further away from the via but that otherwise would eventually migrate to the via (e.g., vacancies 172, 174) are instead drawn into and held in the trap regions.

Although FIG. 1 illustrates various particular implementations of stressor elements for stress migration mitigation, other configurations may be implemented according to the teachings of the present disclosure. For example, rather than use a combination of compressive and tensile stressor elements as shown with respect to the implementation of metal trace 108, in some implementations only one or more compressive stressor elements may be used to expel vacancies from targeted regions. To illustrate, rather than implement the compressive stressor element 156 flanked by the two tensile stressor elements 152 and 154 as shown in FIG. 1, an alternative implementation could include only the compressive stressor element 156 overlying the contact area 150 (that is, without also implementing the tensile stressor elements 152 and 154).

Figure 2:
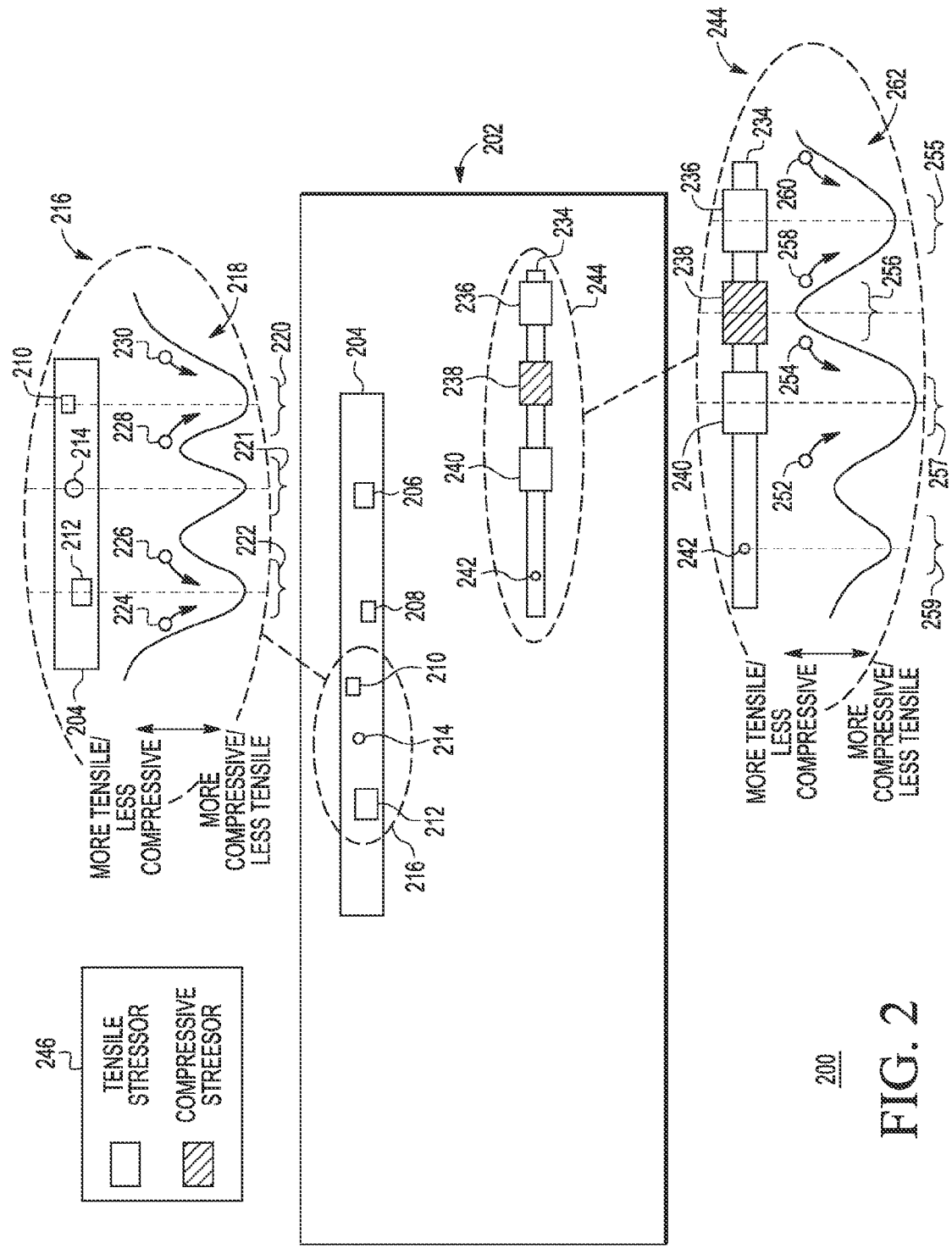
FIG. 2 is a top view of a metal layer of an IC device illustrating additional example implementations of stressor elements for stress migration mitigation in accordance with at least one embodiment of the present disclosure.

FIG. 2 shows a top layer view of a metal layer 202 of a metal stack of an IC device 200 in accordance with at least one embodiment. The metal layer 202 depicts additional approaches to utilizing stressor elements for stress migration mitigation in accordance with the techniques described herein. The metal layer 202 includes two metal traces 204 and 234, with metal trace 204 depicting a stress migration mitigation arrangement using a series of tensile stressor elements, and metal trace 234 implementing a stress migration mitigation arrangement using compressive stressor elements and tensile stressor elements. As described below, each of these stress migration mitigation configurations induces a different vacancy migration pattern into the corresponding metal trace. The stressor elements can be formed as stress-inducing materials that overlie the metal traces, either partially or completely, or as stress memorization effects in the metal traces themselves.

In the depicted example, the metal trace 204 is connected to a metal trace of a lower or upper metal layer using a via contacting the metal trace 204 at the illustrated contact area 214. To mitigate vacancy migration into this via, the IC device 200 implements a stress migration mitigation arrangement whereby multiple tensile stressor elements 206, 208, 210, and 212 are at the metal trace 204. These tensile stressor elements 206, 208, 210, and 212 are smaller in width than the width of the metal trace 204 and each introduces a local compressive stress effect into the metal trace 204 so as to alter the stress effect of the metal trace 204 and form trap regions for migrating vacancies in various locations of the metal trace 204. Further, because the tensile stressor elements 206, 208, 210, and 212 do not span the entire width of the metal trace 204, the metal trace 204 may maintain its conductive integrity along its length as the trap regions are limited to only a portion of the width at any given point on the metal trace 204. As shown by key 246 of FIG. 1, trap regions are illustrated as boxes with hatching.

An exploded view 216 of the metal trace 204 in a region around the contact area 214 includes a stress chart 218 aligned with the portion of the metal trace 204 depicted in the exploded view 216, such that the abscissa represents the lateral extent of the portion of the metal trace 204 and the ordinate represents the stress type and magnitude present in the corresponding location of the metal trace 204. As depicted by the stress chart 218, the presence of the via in the metal trace 204 introduces a compressive stress effect in the metal trace 204 in a region extending from the contact area 214, and thus creates a localized compressive stress 221 in the metal trace 204 at the contact area 214 that alters the stress effect of the metal trace 204. As also depicted by the stress chart 218, each of the tensile stressor elements 210 and 212 introduces a corresponding region of compressive stress in the metal trace 204, and thus introduces regions of compressive stress effect in the metal trace 204 and alters the corresponding effects 220 and 222, respectively, which are laterally offset from the contact area 214, making the effects 220 and 222 more compressive in nature. As such, the regions of the metal trace 204 in which these localized compressive stress effects 220 and 222 form trap regions that draw in vacancies (e.g., vacancies 224, 226, 228, and 230) from the surrounding regions of the metal trace 204. Thus, by placing one or more tensile stressor elements along a lateral length of a metal trace, one or more trap regions can be introduced into the metal trace to trap migrating vacancies in the metal trace.

The metal trace 234 also is connected to a lower or upper metal layer using a via, which interfaces with the metal trace 234 at a contact area 242. To form trap regions near the via for the purpose of trapping migrating vacancies, tensile stressor elements 236 and 240 are disposed on the metal trace 234 such that the tensile stressor elements 236 and 240 are laterally displaced from the contact area 242 in one direction and separated by a repel region formed by a compressive stressor element 238.

An exploded view 244 of the metal trace 234 in a region surrounding the contact area 242 includes a stress chart 262 aligned with the depicted portion of the metal trace 234. As depicted by the stress chart 262, the presence of the via in the metal trace 243 introduces a more compressive/less tensile stress effect in the metal trace 243 in a region extending from the contact area 242, and thus creates a localized compressive stress effect 259 in the metal trace 234 at the contact area 242. As also depicted by the stress chart 262, the compressive stressor element 238 introduces a region of tensile stress in the metal trace 234 in a region laterally displaced from the contact area 242, and thus alters the stress effect 256 in the metal trace 234, laterally displaced from the contact area 242, to be more tensile in nature. Each of the tensile stressor elements 236 and 240 introduces a corresponding region of compressive stress in the metal trace 234, and thus alters the corresponding stress effects 255 and 257, respectively, which are laterally displaced from the contact area 242, to be more compressive in nature. As a result of the formation of the repel region laterally displaced from the contact area 242 of the via, and the two trap regions laterally offset from the contact area 242, vacancies in proximity to repel region (e.g., vacancies 254 and 258) are driven towards the trap regions and vacancies in proximity to the trap regions (e.g., vacancies 252 and 260) are drawn into and held in the trap regions. Thus, all vacancies (e.g. vacancies 252, 254, 258, and 260) present in the metal trace 234 and in proximity to the contact area 242 of the metal trace 234 are driven away from the contact area and into the trap regions.

Figure 3:
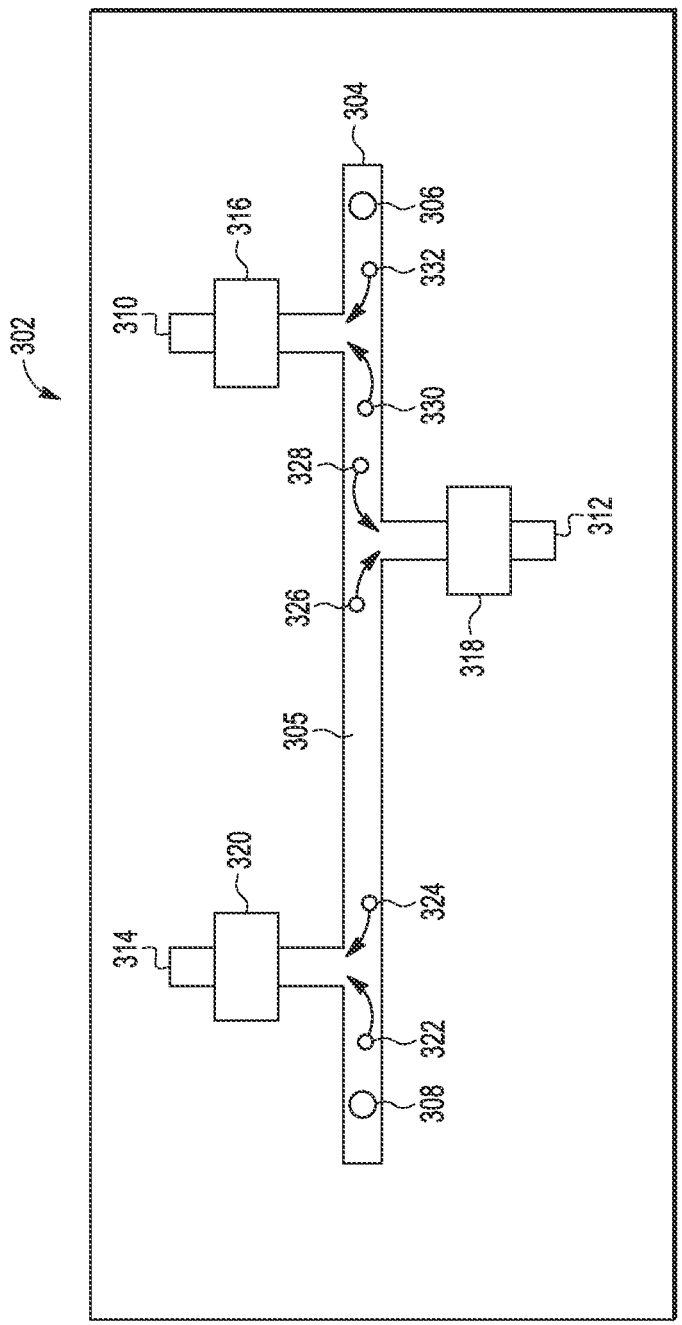
FIG. 3 is a top view of a metal layer of an IC device illustrating stressor elements formed at stubs of a metal trace of the metal layer in accordance with at least one embodiment of the present disclosure.

FIG. 3 shows a top layer view of a metal layer 302 of a metal stack of an IC device 300 in accordance with at least one embodiment. The metal layer 302 depicts a stub-based stress migration mitigation arrangement. To this end, the metal layer 302 includes a metal trace 304 implementing a stress migration mitigation arrangement using a series of tensile stressor elements overlying a series of metal stubs extending from a primary length, or lateral component, of the metal trace. As described below, the depicted stress migration mitigation arrangement induces a vacancy migration pattern into the corresponding metal trace whereby migrating vacancies are eventually drawn into the stubs and away from the vias in the metal trace 304. As with the key 134 of FIG. 1 and the key 246 of FIG. 2, the tensile stressor elements, or trap regions, are represented by boxes without hatching.

In the depicted example, the metal trace 304 is connected to a metal trace of a lower or upper metal layer using two vias contacting the metal trace 304 at the illustrated contact areas 306 and 308. To mitigate vacancy migration into these vias, the IC device 300 implements a stress migration mitigation arrangement whereby multiple tensile stressor elements 316, 318, and 320 overly a series of metal stubs 310, 312, and 314 extending from a lateral component 305 of the metal trace 304. The presence of the vias in the metal trace 304 introduces a compressive stress effect in the metal trace 304 in regions extending from the contact areas 306 and 308, and thus alters the stress in the metal trace 304 at the contact areas 306 and 308 to be more compressive/less tensile in nature. Each of the tensile stressor elements 316, 318, and 320 introduces a corresponding region of stress in the metal trace 304, and thus alters the stress effects in the metal stubs 310, 312, and 314, respectively. As a result of the stress effects that are altered in the metal stubs 310, 312, and 314, the metal stubs become regions of the metal trace 304 in which these altered stress effects that have become more compressive in nature form trap regions that draw in vacancies (e.g. vacancies 322, 324, 326, 328, 330, and 332) from the lateral component 305 of the metal trace 304 into the electrically-non-functional stubs 310, 312, and 314. Thus, through the placement of these tensile stressor elements 316, 318, and 320 at metal stubs 310, 312, and 314, one or more trap regions are introduced into regions of the metal trace 304 to trap migrating vacancies in the metal trace 304.

Having stubs 310, 312, and 314 extending from the lateral component 305, or primary length, of the metal trace 304 allows for the vacancies 322, 324, 326, 328, 330, and 332 to accumulate at a distance away from the contact areas 306 and 308. Additionally, the vacancies 322, 324, 326, 328, 330, and 332 accumulate out of the conductive path formed in the metal trace 304, and thus mitigate potential disruption that could be caused by the accumulation of vacancies within the lateral component 305 of the metal trace 304. By utilizing stubs 310, 312, and 314, the vacancies are made to migrate away from the via contact areas 306, 308 and accumulate away from the primary length of the metal trace 304 to prevent both via failure or disruption in the metal trace 304.

Figure 4:
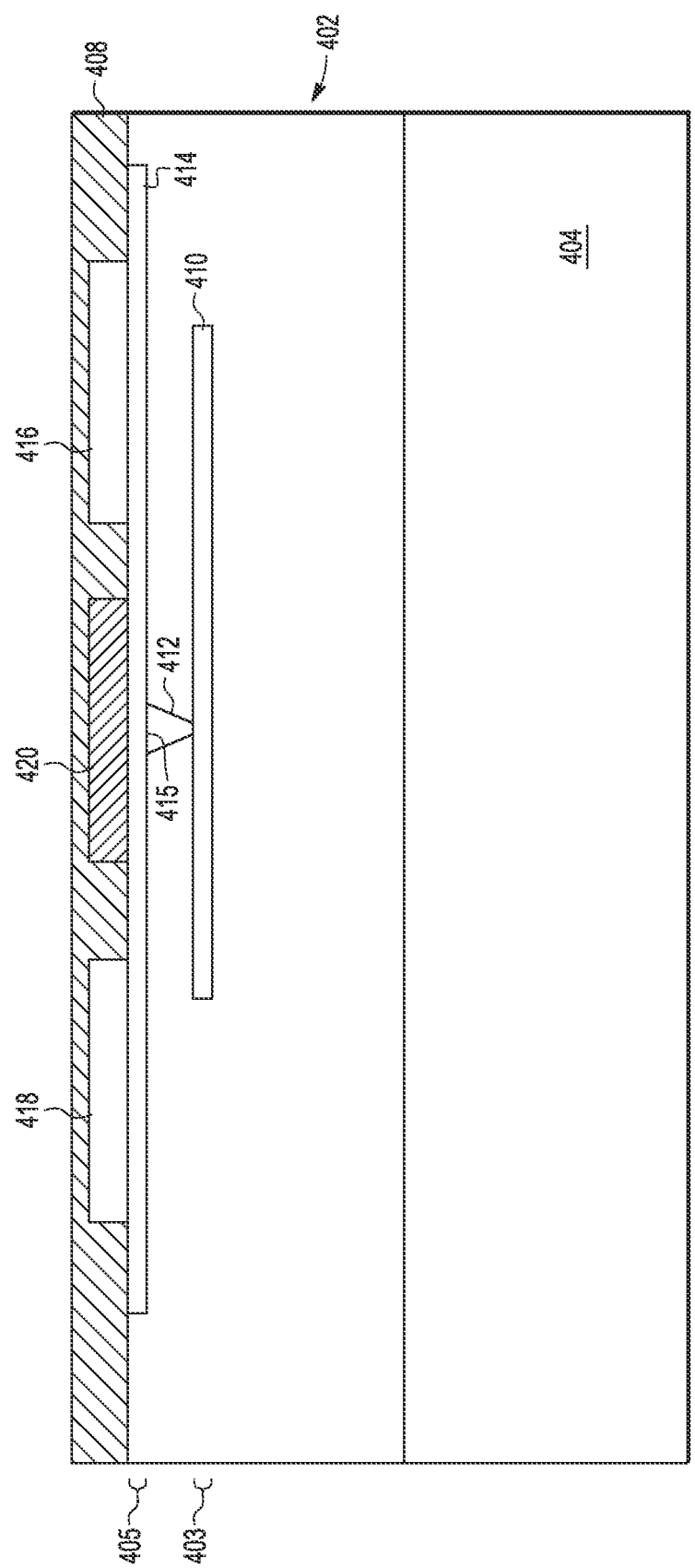
FIG. 4 is a cross-sectional view of a metal stack of an IC device that employs stressor elements for stress migration mitigation in accordance with at least one embodiment of the present disclosure.

FIG. 4 shows a cross-sectional view of an IC device 400 that employs stressor elements for stress migration mitigation in accordance with at least one embodiment. The IC device 400 may correspond to, for example, the IC devices 100, 200, and 300 of FIGS. 1, 2, and 3, respectively. The IC device 400 includes a metal stack 402 formed overlying a die 404 or other substrate. In this example, the metal stack 402 comprises two adjacent metal layers 403 and 405, with a metal trace 410 formed at the metal layer 403 and a metal trace 414 formed at the metal layer 405, and whereby the metal traces 410 and 414 are connected by a via 412 that extends between the metal traces 410 and 414 and contacts the metal trace 414 at a contact area 415.

The via 412 causes the stress to be less tensile or more compressive in the metal trace 414, and thus otherwise would cause vacancies within the metal trace 414 to eventually migrate to the via 412 in the absence of any stressors. This vacancy migration could impact the integrity of the via 412 over time. To mitigate this vacancy migration, the IC device 400 employs a stress migration mitigation configuration to route or steer migrating vacancies away from the via 412. In the illustrated example, the stress migration mitigation configuration includes a configuration similar to the stress migration mitigation configuration described above with respect to the metal trace 108 of FIG. 1. In particular, tensile stressor elements 416 and 418 are formed at the metal trace 414 at locations laterally displaced from the contact area 415 and via 412, and a compressive stressor element 420 is formed on the metal trace 414 at a location at least partially aligned with the contact area 415. As also illustrated by FIG. 4, a conventional interlayer dielectric (ILD) material 408 is formed overlying the metal layer 405 and the stressor elements 418, 416, and 420 such that the ILD material 408 is disposed in regions between the stress-inducing material of the stressor elements 416, 418, and 420. Stressor elements may be similarly fabricated for other stress migration mitigation configurations, such as the other stress migration mitigation configurations described above with reference to FIGS. 1, 2, and 3.

Some or all of the stressor elements 416, 418, and 420 may be formed from stress-inducing dielectric material formed overlying the metal trace 414 in the respective locations. To illustrate, the tensile stressor elements 416 and 418 may be formed from one or a combination of tensile stress-inducing dielectric materials, such as silicon nitride ("SiN" or $Si_3N_4$), tetraethylorthosilicate (TEOS), SiC, SiCN. Stress is developed in these materials by depositing them under conditions that cause stress build-up in them, such as very high deposition rate/high power or low temperature. The compressive stressor element 420 may be formed from one or a combination of compressive stress-inducing dielectric materials, such as "SiN" or $Si_3N_4$, tetraethylorthosilicate (TEOS), SiC, SiCN. Alternatively, some or all of the stressor elements 416, 418, and 420 may be formed from stress-inducing conductive material overlying the metal trace 414 in the respective locations. To illustrate, certain capping layer materials, such as cobalt tungsten phosphide (CoWP) and $SiC_xN_yH_z$, introduce tensile or compressive stress into the underlying copper (Cu) line, and thus capping layer materials can be selectively formed as a capping layer of the metal trace 414 in a region corresponding to the intended stressor element, or alternatively to induce the opposite stress effect the capping layer material may be removed from the metal trace 414 from a region corresponding to the intended stressor element. Moreover, in some embodiments, one or more of the stressor elements 416, 418, and 420 may be formed using stress-inducing dielectric material while others may be formed using stress-inducing capping layer material. The stress-inducing material of one or more of the stressor elements 416, 418, 420 can be selectively formed using a selective deposition process, such as ion-beam deposition process or an electron beam-induced deposition process. Alternatively, the stress-inducing material of one or more of the stressor elements 416, 418, 420 may be formed by forming a blanket layer of the stress-inducing material overlying the metal layer and then selectively patterning the blanket layer using a selective etch process. In the event that the stress-inducing material is a dielectric material, the dielectric material may be formed overlying the metal trace either before or after the formation of a capping layer for the metal trace 414.

Although FIG. 4 illustrates the stressor elements 416, 418, and 420 as stress-inducing material overlying the metal trace 414, in some embodiments one or more of the stressor elements 416, 418, and 420 may instead be part of the metal trace 414 itself, whereby a stress memorization technique (SMT), commonly used for stress memorization effect in n-metal oxide silicon field effect transistors (n-MOSFET), can instead be adapted so as to induce a stress memorization effect (i.e., a stress effect) in the metal trace 414 itself. In such circumstances, the portion of the metal trace 414 that has the stress memorization effect is considered a stressor element at the metal trace. The applied SMT can include, for example, the selective deposition or other selective formation of a stress-inducing film on the metal trace 414 so as to induce permanent stress effects in certain regions of the metal trace 414 and then removal of the stress-inducing film with the stress effects remaining in the metal trace 414.

Figure 5:
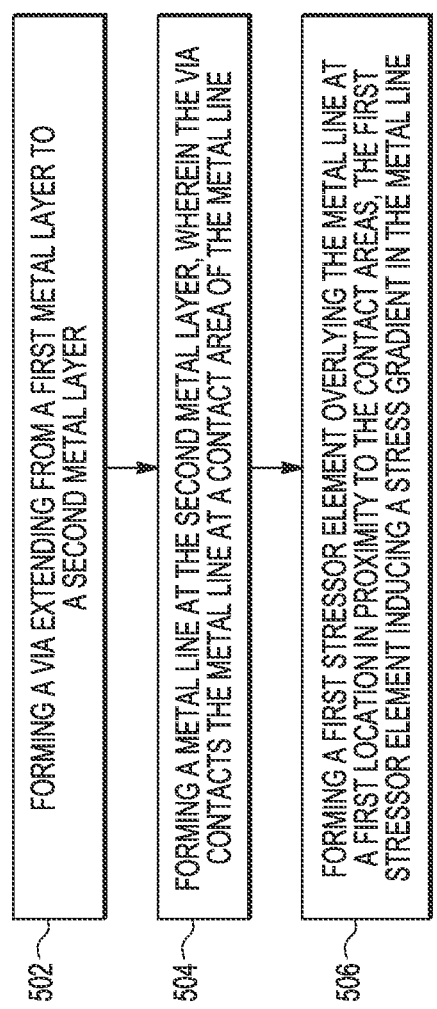
FIG. 5 is a flow diagram illustrating a method of fabricating an IC device employing stressor elements for stress migration mitigation in accordance with at least one embodiment of the present disclosure.

FIG. 5 illustrates a method 500 of fabricating an IC device employing stressor elements for stress migration mitigation in accordance with at least one embodiment. The method initiates at block 502 with initiation of the fabrication of a metal stack of the IC device over a die or other substrate. As part of the metal stack formation, a via (e.g., via 412, FIG. 4) is formed that extends from a first metal layer to a second metal layer. At block 504, a metal trace (e.g., metal trace 414, FIG. 4) is formed at the second metal layer, wherein the via contacts the metal trace at a contact area (e.g., contact area 415, FIG. 4) of the metal trace. At block 506, a stressor element (e.g., stressor elements 416, 418, 420, FIG. 4) is formed at a location of the metal trace. The location of the metal trace may be in proximity to the contact area (that is, either overlying or laterally near the contact area), or the location of the metal trace may be at a stub of the metal trace. The stressor element may also be formed at a location where a subsequent upper via has been formed. The stressor element may be formed through the permanent formation of a stress-inducing dielectric material or stress-inducing conductive material overlying the metal trace at that location. Alternatively, the stressor element may be formed through a SMT process to induce a stress memory effect in the metal trace at that location. In either implementation, the stressor element induces a stress effect within the metal trace. The stressor element may comprise a tensile stressor element that induces a compressive stress effect at the location of the metal trace, and thus serves to form a trap region for migrating vacancies in the metal trace. Alternatively, the stressor element may comprise a compressive stressor element that induces a tensile stress effect at the location of the metal trace, and thus serves as a repel region at the location of the metal trace. Multiple stressor elements may be formed at the metal trace, including, for example, a series of tensile stressor elements to form a series of trap regions, or a compressive stressor element may be formed overlying the contact area of the via so as to form a repel region around the via, and one or more tensile stressor elements may be formed as laterally displaced from the contact area to serve as trap regions to capture vacancies repelled from the repel region.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. An integrated circuit (IC) device, the IC device comprising:
   a metal layer comprising a metal trace;
   a via extending from the metal trace; and
   a first stressor element at a first location of the metal trace that is in proximity to a contact area between the via and the metal trace, the first stressor element altering a stress in the metal trace at the first location;
   wherein the first stressor element comprises one of: a stress-inducing material overlying the metal trace at the first location with non-stress-inducing inter-layer dielectric material overlying the metal trace in one or more areas adjacent to the first stressor element; and a portion of the metal trace at the first location having an induced stress memorization effect.

2. The IC device of claim 1, wherein:
   the first stressor element comprises a tensile stressor element;
   the first location is laterally displaced from the contact area; and
   the first stressor element alters the stress in the metal trace at the first location to be one of: more compressive or less tensile.

3. The IC device of claim 2, wherein:
   the metal trace comprises a stub extending from a primary length of the metal trace; and
   wherein the first location is a location at the stub.

4. The IC device of claim 1, wherein:
   the first stressor element comprises a compressive stressor element;
   the first location overlies the contact area; and
   the first stressor element alters the stress in the metal trace at the first location to be one of: less compressive or more tensile.

5. The IC device of claim 1, further comprising:
   a second stressor element at a second location of the metal trace that is in proximity to the contact area, the second stressor element altering a stress in the metal trace at a second location.

6. The IC device of claim 5, wherein:
   the first stressor element comprises a tensile stressor element that alters the stress in the metal trace at the first location to be one of: more compressive or less tensile, and the first location is laterally displaced from the contact area; and
   the second stressor element comprises a compressive stressor element that alters the stress in the metal trace at the second location to be one of: less compressive or more tensile, and the second location overlies the contact area.

7. The IC device of claim 5, wherein:
   the first stressor element comprises a first tensile stressor element that alters the stress in the metal trace at the first location to be one of: more compressive or less tensile, and the first location is laterally displaced from the contact area in a first direction; and
   the second stressor element comprises a second tensile stressor element that alters the stress in the metal trace at the second location to be one of: more compressive or less tensile, and the second location is laterally displaced from the contact area in a second direction opposite the first direction.

8. The IC device of claim 7, further comprising:
   a third stressor element of a first location of the metal trace that overlies the contact area, the third stressor element comprising a compressive stressor element that alters the stress in the metal trace at the first location to be one of: less compressive or more tensile.

9. The IC device of claim 1, wherein:
   the first stressor element comprises the stress-inducing material overlying the metal trace at the first location with non-stress-inducing inter-layer dielectric material overlying the metal trace in one or more areas adjacent to the first stressor element.

10. The IC device of claim 1, wherein:
the first stressor element comprises the portion of the metal trace at the first location having the induced stress memorization effect.

11. An integrated circuit (IC) device comprising:
a metal trace at a metal layer, the metal trace comprising a lateral component and a stub extending from the lateral component;
a via contacting the metal trace at a contact area of the lateral component; and
a first stressor element at the stub, the stressor element comprising a tensile stress-inducing material that alters a stress in the metal trace to be one of: more compressive or less tensile.

12. The IC device of claim 11, further comprising:
a second stressor element overlying the lateral component at the contact area, the second stressor element comprising a compressive stress-inducing material that alters a stress in the metal trace to be one of: less compressive or more tensile.

13. The IC device of claim 12, further comprising:
non-stress-inducing material disposed on the metal trace in areas surrounding the first stressor element and the second stressor element.

14. A method of fabricating an integrated circuit (IC) device, the method comprising:
forming a via extending from a first metal layer to a second metal layer;
forming a metal trace at the second metal layer, wherein the via contacts the metal trace at a contact area of the metal trace; and
forming a first stressor element at a first location of the metal trace that is in proximity to the contact area, the first stressor element altering a stress in the metal trace at the first location;
wherein forming the first stressor element comprises at least one of:
forming a stress-inducing material overlying the metal trace at the first location with non-stress-inducing inter-layer dielectric material overlying the metal trace in one or more areas adjacent to the first stressor element; and
inducing a stress memorization effect at a portion of the metal trace at the first location.

15. The method of claim 14, wherein:
the first stressor element comprises a tensile stressor element;
the first location is laterally displaced from the contact area; and
the tensile stressor element alters the stress in the metal trace at the first location to be one of: more compressive or less tensile.

16. The method of claim 15, wherein:
forming the metal trace comprises forming a stub extending from a primary length of the metal trace; and
the first location comprises a location on the stub.

17. The method of claim 15, wherein:
the first stressor element comprises a compressive stressor element;
the first location overlies the contact area; and
the compressive stressor element alters the stress in the metal trace at the first location to be one of: less compressive or more tensile.

18. The method of claim 17, further comprising:
forming a second stressor element at a second location laterally displaced from the contact area, wherein the second stressor element comprising a tensile stressor element that alters a stress in the metal trace at the second location to be one of: more compressive or less tensile.

19. The method of claim 15, wherein forming the first stressor element comprises:
forming the stress-inducing material overlying the metal trace at the first location with non-stress-inducing inter-layer dielectric material overlying the metal trace in one or more areas adjacent to the first stressor element.

20. The method of claim 15, wherein forming the first stressor element comprises:
inducing the stress memorization effect at the portion of the metal trace at the first location.

* * * * *